United States Patent
Li et al.

(10) Patent No.: US 10,712,379 B2
(45) Date of Patent: Jul. 14, 2020

(54) ELECTROMAGNETIC COMPATIBILITY TEST SYSTEM AND METHOD FOR ON-SCREEN-DISPLAY DATA

(71) Applicant: GUANGZHOU CHANGEN ELECTRONIC TECHNOLOGY CO., LTD, Guangdong (CN)

(72) Inventors: Nan Li, Guangdong (CN); Jun Li, Guangdong (CN)

(73) Assignee: GUANGZHOU CHANGEN ELECTRONIC TECHNOLOGY CO., LTD, Guangdong (CN)

( * ) Notice: Subject to any disclaimer, the term of this patent is extended or adjusted under 35 U.S.C. 154(b) by 0 days.

(21) Appl. No.: 16/070,787

(22) PCT Filed: Dec. 30, 2016

(86) PCT No.: PCT/CN2016/113874
§ 371 (c)(1),
(2) Date: Jul. 18, 2018

(87) PCT Pub. No.: WO2017/124914
PCT Pub. Date: Jul. 27, 2017

(65) Prior Publication Data
US 2019/0018055 A1    Jan. 17, 2019

(30) Foreign Application Priority Data
Jan. 21, 2016 (CN) .......................... 2016 1 0042005

(51) Int. Cl.
*G01R 31/00* (2006.01)
*G01R 1/02* (2006.01)

(52) U.S. Cl.
CPC ........... *G01R 31/001* (2013.01); *G01R 1/025* (2013.01)

(58) Field of Classification Search
CPC ........................... G01R 31/001; G01R 1/025
See application file for complete search history.

(56) References Cited

FOREIGN PATENT DOCUMENTS

| CN | 101004364 A | 7/2007 |
|---|---|---|
| CN | 201804199 U | 4/2011 |

(Continued)

OTHER PUBLICATIONS

State Intellectual Property Office of the PR China; dated Mar. 3, 2017.

*Primary Examiner* — Farhana A Hoque
(74) *Attorney, Agent, or Firm* — Patshegen IP LLC; Moshe Pinchas

(57) ABSTRACT

Provided is an electromagnetic compatibility testing system and method for data on-screen display, the electromagnetic compatibility testing system for data on-screen display includes a testing unit, a data acquiring unit, a camera monitoring unit, and an on-screen display controlling unit, wherein the data acquiring unit is configured to acquire the first test data generated by the testing unit, extract target data from the first test data, generate a second test data, and send the obtained second test data to the on-screen display controlling unit; the camera monitoring unit is configured to perform a video monitoring on a test area, and send the obtained video data to the on-screen display controlling unit; and the on-screen display controlling unit is configured to display the received second test data and the video data on the same screen.

12 Claims, 4 Drawing Sheets

(56) References Cited

FOREIGN PATENT DOCUMENTS

| | | | | |
|---|---|---|---|---|
| CN | 102346221 | * | 2/2012 | ............. G01R 31/00 |
| CN | 102346221 A | | 2/2012 | |
| CN | 102707170 A | | 10/2012 | |
| CN | 103217607 A | | 7/2013 | |
| CN | 203289574 U | | 11/2013 | |
| CN | 204031344 U | | 12/2014 | |
| CN | 204127586 U | | 1/2015 | |
| CN | 104933104 A | | 9/2015 | |
| CN | 105467255 A | | 4/2016 | |
| CN | 205749703 U | | 11/2016 | |
| KR | 101444312 B1 | | 9/2014 | |

\* cited by examiner

ELECTROMAGNETIC COMPATIBILITY TEST SYSTEM AND METHOD FOR ON-SCREEN-DISPLAY DATA

CROSS-REFERENCE TO RELATED APPLICATIONS

This application claims the benefit of priority to Chinese Patent Application No. 201610042005.X, filed on Jan. 21, 2016, and entitled "ELECTROMAGNETIC COMPATIBILITY TESTING SYSTEM AND METHOD FOR DATA ON-SCREEN DISPLAY", which disclosures are herein incorporated by reference.

TECHNICAL FIELD

The present disclosure relates to a field of electromagnetic interference and particularly to an electromagnetic compatibility testing system and method for data on-screen display.

BACKGROUND

In a place where electromagnetic compatibility testing is performed, on the one hand, a monitoring camera performs a real-time monitoring on a test area and a test sample, and on the other hand, an electromagnetic compatibility testing device tests the test sample and generates test data or a test report; commonly, the test report cannot be displayed in a monitoring video in real time. A monitoring personnel needs to watch the monitoring video on the one hand, and then record the test data in a test software when abnormality is found; or observe the monitoring video when abnormal data is seen. In this way, there will be a time difference between the monitoring video and the test data, and accurate detection results cannot be recorded.

Therefore, it is necessary to provide an electromagnetic compatibility test system and method for displaying data on the screen, so as to realize that the test data and the monitoring video are displayed synchronously.

SUMMARY

To address the deficiency of the existing technology, the present disclosure provides an electromagnetic compatibility testing system and method for data on-screen display.

A first aspect of the present disclosure provides an electromagnetic compatibility testing system for data on-screen display, which includes: a testing unit, a data acquiring unit connected with the testing unit, a camera monitoring unit, and an on-screen display controlling unit connected with the camera monitoring unit and the data acquiring unit respectively, wherein, the testing unit is configured to test a test equipment, and generate a first test data;

the data acquiring unit is configured to acquire the first test data generated by the testing unit, and further configured to extract target data from the first test data, and generate a second test data according to the obtained target data, and send the obtained second test data to the on-screen display controlling unit;

the camera monitoring unit is configured to perform a video monitoring on a test area, and generate video data, and send the obtained video data to the on-screen display controlling unit; and the on-screen display controlling unit is configured to display the received second test data and the video data on the same screen.

According to a first implementation of the present disclosure, the first test data has a fixed data structure, the first test data has at least one preset feature value and at least one target data.

Furthermore, the first test data has N target data, and the preset feature value and the $k^{th}$ target data are separated by $Q_k$ characters, wherein N and $Q_k$ are natural numbers which are not less than 1, and k is a natural number which is not greater than N; and the data acquiring unit being configured to acquire the first test data generated by the testing unit, and extract the target data from the first test data, and generate the second test data according to the obtained target data, and send the obtained second test data to the on-screen display controlling unit, comprises:

the data acquiring unit is configured to acquire the first test data generated by the test unit, and analyze the data structure of the first test data; and the data acquiring unit is further configured to capture the preset feature value from the first test data, and locate N target data in sequence according to a number of characters which separate the captured preset feature value and the $k^{th}$ target data, and then extract N target data from the first test data; and the data acquiring unit is further configured to generate the second test data according to the obtained N target data, and send the second test data to the on-screen display controlling unit.

Furthermore, the first test data has N target data, and the preset feature value and the $k^{th}$ target data are separated by $Q_k$ characters, the $k^{th}$ target data and k+1th target data are separated by $R_k$ characters, wherein N, $Q_k$, and $R_k$ are natural numbers which are not less than 1, and k is a natural number which is not greater than N; and the data acquiring unit being configured to acquire the first test data generated by the testing unit, and extract the target data from the first test data, and generate the second test data according to the obtained target data, and send the obtained second test data to the on-screen display controlling unit, further comprises:

the data acquiring unit is configured to acquire the first test data generated by the testing unit, and analyze the data structure of the first test data; and the data acquiring unit is further configured to capture the preset feature value from the first test data, and locate the $k^{th}$ target data according to a number of characters separating the captured preset feature value and the $k^{th}$ target data, and then extract the $k^{th}$ target data from the first test data, and further locate the $k+1^{th}$ target data according to a number of characters separating the $k^{th}$ target data and the $k+1^{th}$ target data, and then extract the $k+1^{th}$ target data from the first test data, until N target data has been captured; and the data acquiring unit is further configured to generate the second test data according to the obtained N target data, and send the second test data to the on-screen display controlling unit.

According to a second implementation of the present disclosure, the data acquiring unit being configured to acquire the first test data generated by the testing unit further comprises: the data acquiring unit is configured to acquire the first test data generated by the testing unit at a preset acquisition frequency.

According to a third implementation of the present disclosure, the on-screen display controlling unit includes a displaying module, the displaying module further includes a LED display, the LED display is configured to display the received second test data and the video data on the same screen.

According to a fourth implementation of the present disclosure, the camera monitoring unit comprises a camera, the camera comprises a camera shielding case, a holder, and a cloud deck shielding case, wherein the holder is a hollow structure, and an inner cavity of the camera shielding case is communicated with an inner cavity of the cloud deck shielding case through the holder of the hollow structure; a lens, a camera mainboard, an optical fiber transceiver, and a first filter are arranged in the camera shielding case; the camera shielding case is further provided with an optical fiber interface; the lens is connected with the camera mainboard, the camera mainboard is connected with the optical fiber transceiver, the optical fiber transceiver is connected with the optical fiber interface through an optical fiber; output ends of the first filter are connected with the camera mainboard and the optical fiber transceiver respectively to supply power to the camera mainboard and the optical fiber transceiver.

According to a fifth implementation of the present disclosure, the first filter comprises a first feedthrough capacitor, a first cylinder, a first shielding cover, one end of the first cylinder is fastened on the inner side of a rear end cover of the camera shielding case, the first feedthrough capacitor is accommodated in the first cylinder, and the first shielding cover is mounted on the other end of the first cylinder, so that the first feedthrough capacitor is isolated in the first cylinder.

In this implementation, the shielding case is further provided with a power line hole, the power line hole and the optical fiber interface are arranged on a rear end cover of the camera shielding case. The power line hole is in a fastening range of the first cylinder, and the power line is connected to the first feedthrough capacitor through the power line hole; the first cylinder is provided with three small holes for a lead of the first feedthrough capacitor passing through from a small hole in the first cylinder and entering the camera shielding case to supply power.

Furthermore, the two ends of the first cylinder are provided with a thread, and one end of the first cylinder is screwed to the inner side of the rear panel of the camera shielding case; the first shielding cover is screwed to the other end of the first cylinder.

According to a sixth implementation of the present disclosure, a second filter and a bus controlling module are arranged in the cloud deck shielding case; the camera mainboard are connected with an input end of the second filter through a power line and a control wire extending through the cavity of the hollow holder, and the input end of the second filter is connected with the bus controlling module.

Furthermore, the second filter comprises a second feedthrough capacitor, a second cylinder, a second shielding cover, one end of the second cylinder is fastened to the intercommunicating pore which is at an area where the inner side of the cloud deck shielding case and the hollow holder is communicated with each other (specifically, the intercommunicating pore can be a left through hole or a right through hole provided on left and right sides of a first groove of the cloud deck shielding case in the fourth implementation of the present disclosure; the intercommunicating pore is in a fastening range of the second cylinder), the second feedthrough capacitor is accommodated in the second cylinder, and the second shielding cover is mounted on the other end of the second cylinder, thereby isolating the second feedthrough capacitor in the second cylinder.

In this implementation, the power line and the control wire penetrating through the cavity of the holder pass through the intercommunicating pore where the inner side of the cloud deck shielding case and the hollow holder are communicated with each other and join up with the second feedthrough capacitor; the second cylinder is provided with a small hole for a lead of the second feedthrough capacitor passing through the small hole of the second cylinder and entering the cloud deck shielding case. Through the second filter, the power line and the control wire are processed by the second feedthrough capacitor before entering the cloud deck shielding case, which greatly reduces the radiation interference.

Furthermore, one end of the second cylinder is provided with a mounting hole, and is fastened by a nut to the intercommunicating pore where the inner side of the cloud deck shielding case and the hollow holder are communicated with each other, and covers the intercommunicating pore; the other end of the second cylinder is provided with a thread, and the second shielding cover is provided with a matching thread and the second shielding cover is screw joint with the other end of the second cylinder.

According to a seventh implementation of the present disclosure, the hollow holder comprises a supporting seat provided with a through hole, a hollow tube, and a support ring provided with a through hole on the ring wall; the supporting seat and the support ring being respectively sealed and connected with the nozzles at both ends of the hollow tube through the respective through hole.

Furthermore, the camera shielding shell is mounted on the supporting seat, and an opening is left at the bottom of the camera shielding shell and the camera shielding shell is communicated with the cavity of the hollow holder through the supporting seat.

Furthermore, a mounting boss is further arranged on a central position of the supporting seat, and a through hole of the supporting seat penetrates the mounting boss. The mounting boss helps the camera shielding case to be more tightly connected with the supporting seat to further prevent radiation leakage.

According to an eighth implementation of the present disclosure, the cloud deck shielding case is provided with a first groove, the left and right sides of the first groove is provided with a left through hole and a right through hole respectively, the bottom of the first groove is provided with a second groove, a front boss and a rear boss, the bottom of the second groove is provided with a worm, and the worm is placed between the front boss and the rear boss.

Furthermore, the hollow holder is mounted in the first groove, and any one of the left through hole and the right through hole of the first groove communicates with a annular hole of the support ring described in the third implementation of the present disclosure.

Furthermore, the bottom end of the support ring according to the third implementation of the present disclosure is further provided with an engaging teeth matched with the worm. The holder is movably connected to the worm through the engaging teeth at the bottom end of the support ring, and the worm can drive the support ring to rotate around an axis which passes through the center of the support ring, which in turn drives the camera shielding case to perform a pitching motion.

When the support ring rotates around an axis which passes through the center of the support ring, the left and right sides of the support ring are respectively in active contact with the left through hole and the right through hole of the first groove and cover the through holes, the annular hole of the support ring is always communicated with the left through hole and the right through hole of the left and right sides of the first groove separately.

According to a ninth implementation of the present disclosure, the cloud deck shielding case is provided with a motor, and the motor driving the camera shielding case, the holder, and/or the cloud deck shielding case to move through a transmission structure.

Furthermore, the motor comprises a vertical motor and/or a horizontal motor, and the bus controlling module is connected with the vertical motor and/or the horizontal motor; the horizontal motor drives the cloud deck shielding case and then drives the camera shielding case and the holder to rotate horizontally along a vertical axis through a first transmission structure; and the vertical motor drives the holder and then drives the camera shielding case to perform a pitching motion through a second transmission structure.

Furthermore, there are several mechanical limit switches connected between the bus controlling module and the vertical motor and the horizontal motor. The mechanical limit switch is in the normally closed state, and the circuit between the bus controlling module and the vertical motor and the horizontal motor is turned on; when the holder is over pitched, or the cloud deck is over rotated horizontally along the vertical axis, a spring piece of the corresponding mechanical limit switch pops open, and the circuit between the bus controlling module and the vertical motor and the horizontal motor is open.

According to a tenth implementation of the present disclosure, a pickup (such as a microphone), a speaker are arranged in the camera shielding case, the pickup and the speaker are connected with the camera mainboard respectively.

Specifically, the microphone is used to collect a audio signal in the camera room, and send the collected audio signal to the camera mainboard. The camera mainboard receives the audio signal sent by the microphone and processes the audio signal, and sends the processed audio signal to the optical fiber transceiver. The audio signal processed by the camera mainboard is converted into an optical signal and transmitted to an outdoor photoelectric conversion device (such as an optical fiber transceiver) by the optical fiber transceiver, and the optical signal is converted into an audio signal and then played on an external speaker; otherwise, the outdoor sound is converted by an outdoor electro-optical conversion device to an optical signal. The optical signal is transmitted to the optical fiber transceiver, and the optical fiber transceiver converts the optical signal into a digital signal and transmits the digital signal to the camera mainboard. The camera mainboard processes the digital signal and transmits the processed digital signal to the speaker to make the speaker emit a sound.

According to a eleventh implementation of the present disclosure, a monitoring opening of a front panel of the camera shielding case is provided with a shielding glass.

According to a twelfth implementation of the present disclosure, the camera monitoring unit further includes a photoelectric conversion device respectively connected to the optical fiber transceiver of the camera and the on-screen display controlling unit in the fourth implementation of the present disclosure; wherein the on-screen display controlling unit is used for sending a control signal to the photoelectric conversion device, which is also used to acquire an electric signal transmitted by the photoelectric conversion device;

The photoelectric conversion device is configured to acquire a control signal sent by the on-screen display controlling unit, and convert the acquired signal into an optical signal and transmit the optical signal to the optical fiber transceiver of the camera; the photoelectric conversion device is further configured to convert the optical signal transmitted by the optical fiber transceiver into an electric signal (including video and/or audio signals) and then send the electric signal to the on-screen display controlling unit.

Furthermore, the on-screen display controlling unit further includes an intercom module, and the intercom module can specifically include a pickup for collecting audio signals outside the test area;

the on-screen display controlling unit is further used for sending the audio signal collected by the intercom module to the photoelectric conversion device;

The photoelectric conversion device is further configured to acquire the audio signal transmitted by the on-screen display controlling unit, and convert the acquired audio signal into an optical signal and transmit the optical signal to the optical fiber transceiver of the camera.

Furthermore, the intercom module can specifically include a speaker for playing the audio signal received by the on-screen display controlling unit and transmitted by the photoelectric conversion device.

According to the present disclosure, a communication connection is adopted between the testing unit and the data acquiring unit, between the camera monitoring unit and the on-screen display controlling unit, between the data acquiring unit and the on-screen display controlling unit, specifically, a wireless communication connection or a wired communication connection can be employed.

A second aspect of the present disclosure provides an electromagnetic compatibility testing method for data on-screen display, which applies the electromagnetic compatibility testing system for data on-screen display of the first aspect of the present disclosure, which comprises:

the testing unit tests a test equipment, and generates a first test data;

the data acquiring unit acquires the first test data generated by the testing unit, and extracts target data from the first test data, and then generates a second test data according to the obtained target data, and sends the obtained second test data to the on-screen display controlling unit;

the camera monitoring unit performs a video monitoring on a test area, and generates video data, and sends the obtained video data to the on-screen display controlling unit; and the on-screen display controlling unit displays the received second test data and the video data on the same screen.

According to a thirteenth implementation of the present disclosure, the first test data has a fixed data structure, the first test data has at least one preset feature value and at least one target data.

Furthermore, the first test data has N target data, and the preset feature value and the $k^{th}$ target data are separated by $Q_k$ characters, wherein N and $Q_k$ are natural numbers which are not less than 1, and k is a natural number which is not greater than N; and the data acquiring unit acquiring the first test data generated by the testing unit, and extracting the target data from the first test data, and generating the second test data according to the obtained target data, and sending the obtained second test data to the on-screen display controlling unit, comprises:

the data acquiring unit acquires the first test data generated by the test unit, and analyzes the data structure of the first test data; and the data acquiring unit captures the preset feature value from the first test data, and locates N target data in sequence according to a number of characters which separate the captured preset feature value and the $k^{th}$ target data, and then extracts N target data from the first test data; and generates the second test data according to the obtained N target data, and sends the second test data to the on-screen display controlling unit.

Furthermore, the first test data has N target data, and the preset feature value and the $k^{th}$ target data are separated by $Q_k$ characters, the $k^{th}$ target data and k+1th target data are separated by $R_k$ characters, wherein N, $Q_k$, and $R_k$ are natural numbers which are not less than 1, and k is a natural number which is not greater than N; and the data acquiring unit acquiring the first test data generated by the testing unit, and extracting the target data from the first test data, and generating the second test data according to the obtained target data, and sending the obtained second test data to the on-screen display controlling unit, further comprises:

the data acquiring unit acquires the first test data generated by the testing unit, and analyzes the data structure of the first test data; and the data acquiring unit captures the preset feature value from the first test data, and locates the $k^{th}$ target data according to a number of characters separating the captured preset feature value and the $k^{th}$ target data, and then extracts the $k^{th}$ target data from the first test data, and further locates the $k+1^{th}$ target data according to a number of characters separating the $k^{th}$ target data and the $k+1^{th}$ target data, and then extracts the $k+1^{th}$ target data from the first test data, until N target data has been captured; and the data acquiring unit generates the second test data according to the obtained N target data, and sends the second test data to the on-screen display controlling unit.

According to a fourteenth implementation of the present disclosure, the data acquiring unit acquiring the first test data generated by the testing unit further comprises: the data acquiring unit acquires the first test data generated by the testing unit at a preset acquisition frequency.

According to a fifteenth implementation of the present disclosure, the on-screen display controlling unit includes a displaying module, the displaying module further includes a LED display, the LED display is configured to display the received second test data and the video data on the same screen.

Advantageous effects are provided by technical solutions of the present disclosure, that is: the electromagnetic compatibility testing system for data on-screen display provided by the present disclosure collects test data of an electromagnetic compatibility testing equipment by writing a program, and extracts key target data such as frequency points and field intensity, and recombines them into new test data; The new test data and a monitoring video can be synchronously displayed on-screen on the PC side in real-time, which is convenient for testers to easily obtain key test data while observing the video of test sample, which provides great convenience for testers.

In particular, the cloud deck camera provided by the present disclosure adopts a hollow holder, which can conveniently realize the communication between a camera case and the cloud deck. A power line and a signal line can be directly connected to the cloud deck via the hollow holder through the camera case, thereby realizing internal wiring, which makes the entire camera structure with the cloud deck very compact. The dual filter circuit design, which is preferably combined with the present disclosure, can not only effectively shield external electromagnetic interference, but also effectively isolate electromagnetic radiation generated in the camera case and the cloud deck to avoid mutual interference.

BRIEF DESCRIPTION OF THE DRAWINGS

To better illustrate the technical solution of embodiments of the present disclosure, the following descriptions will briefly illustrate the accompanying drawings described in the embodiments. Obviously, the following described accompanying drawings are some embodiments of the present disclosure. Persons skilled in the art can derive other accompanying drawings from these accompanying drawings without creative effort.

DETAILED DESCRIPTION OF ILLUSTRATED EMBODIMENTS

Technical solutions of the present disclosure will be described clearly and completely with reference to the accompanying drawings; obviously, the embodiments described below are merely part of rather than all of the embodiments of the present disclosure. Based on the embodiments of the present disclosure, other embodiments obtained there from without any creative work by those of ordinary skill in the art shall fall into the protection scope of the present disclosure.

What should be noted is, in the disclosure, the technical words "first", "second" are only be used for a descriptive purpose, and are not to be understood to indicate or imply the relative importance or imply the number of the indicated technical features. Therefore, features defined with "first", "second" may include one or more of the features explicitly or implicitly. In the description of the disclosure, "multiple" means two or more than two, unless specifically defined otherwise.

In the disclosure, the technical words "load", "install", "be linked to", "connect to", "fix" et al. should be understood in generalization, unless specifically defined otherwise. For example, these technical words are described as fixed joint or removable connection or the integration of the connection; or mechanical joint or electrical connection; or direct connection or indirect connection via the middle medium or internal connection between the two components. The skilled persons in the art can understand the specific meaning about these technical words in the disclosure according to the specific circumstance.

In the disclosure, unless specifically defined otherwise, the first feature being located on the second feature or under the second feature could disclose the direct connection between the first feature and the second feature, and could also disclose that the first feature is not directly connected to the second feature but adopts other ways to connect to the second feature. Furthermore, the first feature being located "above" and "on" the second feature means that the first feature is located right above the second feature or above the second feature, or only means that the horizontal height of the first feature is higher than that of the second feature. Also the first feature being located "under" and "below" the second feature means that the first feature is located right under the second feature or under the second feature, or only means that the horizontal height of the first feature is lower than that of the second feature.

The implementation of the present disclosure will be described in detail below with reference to specific embodiments.

EMBODIMENT ONE

An electromagnetic compatibility testing system for data on-screen display

Figure 1:
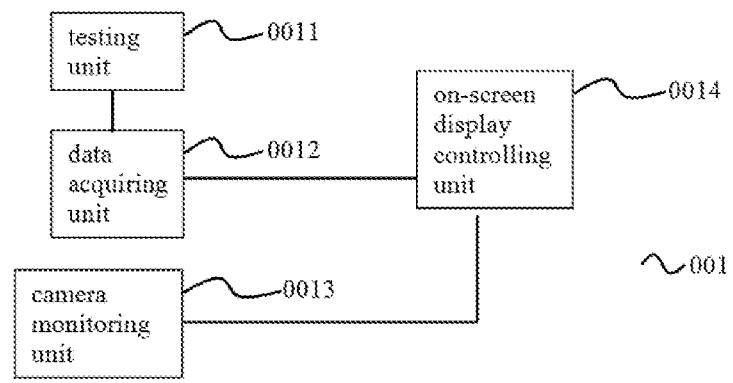
FIG. 1 is a schematic structure diagram illustrating an electromagnetic compatibility testing system for data on-screen display according to an embodiment of the present disclosure.

FIG. 1 is a schematic structure diagram illustrating an electromagnetic compatibility testing system 001 for data on-screen display according to an embodiment of the present disclosure.

As shown in FIG. 1, the present disclosure provides an electromagnetic compatibility testing system 001 for data on-screen display, which includes: a testing unit 0011, a data acquiring unit 0012 connected with the testing unit 0011, a camera monitoring unit 0013, and an on-screen display controlling unit 0014 connected with the camera monitoring unit 0013 and the data acquiring unit 0012 respectively, wherein, the testing unit 0011 is configured to test a test equipment, and generate a first test data;

the data acquiring unit 0012 is configured to acquire the first test data generated by the testing unit 0011, and further configured to extract target data from the first test data, and generate a second test data according to the obtained target data, and send the obtained second test data to the on-screen display controlling unit 0014;

the camera monitoring unit 0013 is configured to perform a video monitoring on a test area, and generate video data, and send the obtained video data to the on-screen display controlling unit 0014; and the on-screen display controlling unit 0014 is configured to display the received second test data and the video data on the same screen.

According to an implementation of the present disclosure, the first test data has a fixed data structure, the first test data has at least one preset feature value and at least one target data.

Furthermore, the first test data has N target data, and the preset feature value and the $k^{th}$ target data are separated by $Q_k$ characters, wherein N and $Q_k$ are natural numbers which are not less than 1, and k is a natural number which is not greater than N; and the data acquiring unit 0012 being configured to acquire the first test data generated by the testing unit 0011, and extract the target data from the first test data, and generate the second test data according to the obtained target data, and send the obtained second test data to the on-screen display controlling unit 0014, comprises:

the data acquiring unit 00012 is configured to acquire the first test data generated by the test unit 0011, and analyze the data structure of the first test data; and the data acquiring unit is further configured to capture the preset feature value from the first test data, and locate N target data in sequence according to a number of characters which separate the captured preset feature value and the $k^{th}$ target data, and then extract N target data from the first test data; and the data acquiring unit 0012 is further configured to generate the second test data according to the obtained N target data, and send the second test data to the on-screen display controlling unit 0014.

Furthermore, the first test data has N target data, and the preset feature value and the $k^{th}$ target data are separated by $Q_k$ characters, the $k^{th}$ target data and k+1th target data are separated by $R_k$ characters, wherein N, $Q_k$, and $R_k$ are natural numbers which are not less than 1, and k is a natural number which is not greater than N; and the data acquiring unit 0012 being configured to acquire the first test data generated by the testing unit 0011, and extract the target data from the first test data, and generate the second test data according to the obtained target data, and send the obtained second test data to the on-screen display controlling unit 0014, further comprises:

the data acquiring unit 0012 is configured to acquire the first test data generated by the testing unit 0011, and analyze the data structure of the first test data; and the data acquiring unit is further configured to capture the preset feature value from the first test data, and locate the $k^{th}$ target data according to a number of characters separating the captured preset feature value and the $k^{th}$ target data, and then extract the $k^{th}$ target data from the first test data, and further locate the $k+1^{th}$ target data according to a number of characters separating the $k^{th}$ target data and the $k+1^{th}$ target data, and then extract the $k+1^{th}$ target data from the first test data, until N target data has been captured; and the data acquiring unit 0012 is further configured to generate the second test data according to the obtained N target data, and send the second test data to the on-screen display controlling unit 0014.

According to an implementation of the present disclosure, the data acquiring unit 0012 being configured to acquire the first test data generated by the testing unit 0011 further comprises: the data acquiring unit 0012 is configured to acquire the first test data generated by the testing unit 0011 at a preset acquisition frequency.

According to an implementation of the present disclosure, the on-screen display controlling unit 0014 includes a displaying module, the displaying module further includes a LED display, the LED display is configured to display the received second test data and the video data on the same screen.

Figure 2:
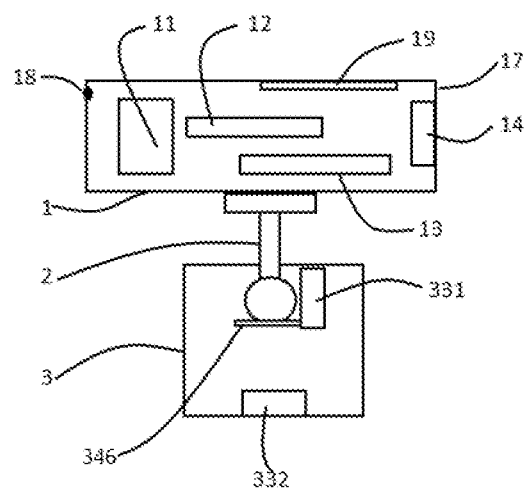
FIG. 2 is a schematic structure diagram illustrating a camera according to an embodiment of the present disclosure.
Figure 3:
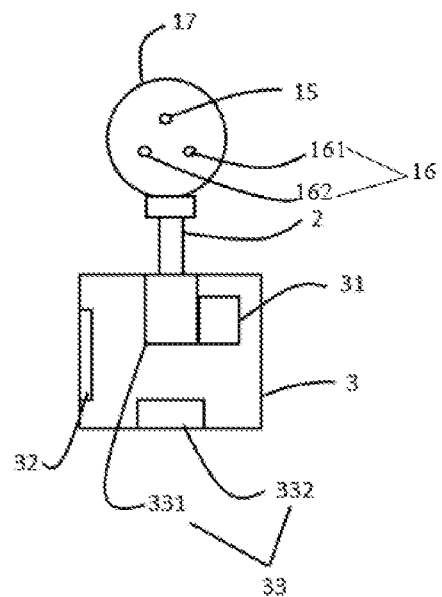
FIG. 3 is a schematic back vision diagram of a camera according to an embodiment of the present disclosure.
Figure 4:
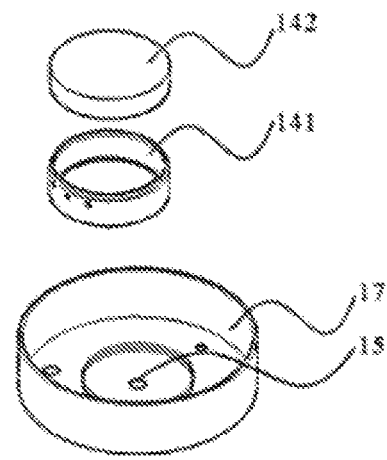
FIG. 4 is a schematic connection diagram of a rear end cover of a camera shielding case and a first filter according to an embodiment of the present disclosure.
Figure 5:
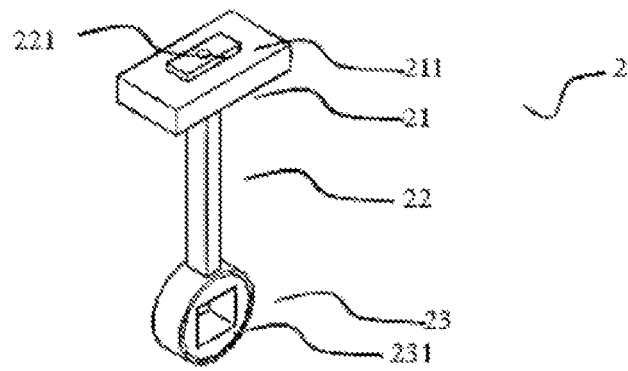
FIG. 5 is a schematic diagram illustrating a holder according to an embodiment of the present disclosure.

According to an implementation of the present disclosure, the camera monitoring unit 0013 comprises a camera 01 provide by the present disclosure. As shown in FIG. 2-FIG. 5, a camera 01 is provided by the present disclosure. FIG. 2 is a schematic structure diagram illustrating a camera 01 according to an embodiment of the present disclosure; FIG. 3 is a schematic back vision diagram of the camera 01 according to an embodiment of the present disclosure. FIG. 4 is a schematic connection diagram of a rear end cover of a camera shielding case 1 and a first filter 14 according to an embodiment of the present disclosure. FIG. 5 is a schematic diagram illustrating a holder 2 according to an embodiment of the present disclosure.

Specifically, as shown in FIG. 2, the camera 01 provided by the present disclosure comprises a camera shielding case 1, a holder 2, and a cloud deck shielding case 3, wherein the holder 2 is a hollow structure, and an inner cavity of the camera shielding case 1 is communicated with an inner cavity of the cloud deck shielding case 3 through the holder 2 of the hollow structure; a lens 11, a camera mainboard 12, an optical fiber transceiver 13, and a first filter 14 are arranged in the camera shielding case 1; a rear panel of the camera shielding case 1 is provided with a power line hole 15 and an optical fiber interface 16 (including an input hole 161 and a output hole 162); the lens 11 is connected with the camera mainboard 12, the camera mainboard 12 is connected with the optical fiber transceiver 13, the optical fiber transceiver 13 is connected with the optical fiber interface 16 through an optical fiber (an internal optical signal of the camera 01 is transmitted by the optical fiber transceiver 13 through the output hole 162 of the optical interface 16 and the external optical fiber; an external signal is transmitted to the optical fiber transceiver 13 via the input hole 161 of the optical interface 16); output ends of the first filter 14 are connected with the camera mainboard 12 and the optical fiber transceiver 13 respectively to supply power to the camera mainboard 12 and the optical fiber transceiver 13.

A second filter 31, a bus controlling module 32, and a motor 33 are arranged in the cloud deck shielding case 3, and the camera mainboard 12 is connected with the input end of the second filter 31 through the power line and the control wire penetrating the cavity of the holder 2, the output end of the second filter 31 is connected to the bus controlling module 32; the bus controlling module 32 is connected to the motor 33. The motor 33 drives the camera shielding case 1, the holder 2 and the cloud deck shielding case 3 through a transmission structure.

Specifically, the motor comprises a vertical motor 331 and/or a horizontal motor 332, and the bus controlling module 32 is connected with the vertical motor 331 and/or the horizontal motor 332; the horizontal motor 332 drives the cloud deck shielding case 3 and then drives the camera shielding case 1 and the holder 2 to rotate horizontally along a vertical axis through a first transmission structure; and the vertical motor 331 drives the holder 2 and then drives the camera shielding case 1 to perform a pitching motion through a second transmission structure.

Furthermore, there are several mechanical limit switches connected between the bus controlling module 32 and the vertical motor 331 and the horizontal motor 332. The mechanical limit switch is in the normally closed state; when the holder 2 is over pitched, or the cloud deck is over rotated horizontally along the vertical axis, a spring piece of the corresponding mechanical limit switch pops open, so as to avoid excessive movement in any direction.

The horizontal motor 32 of the present disclosure employs a conventional horizontal motor transmission structure and will not be described in detail here.

Specifically, in the camera 01 provided by the present disclosure, a pickup 18 (such as a microphone), a speaker 19 are arranged in the camera shielding case 1, the pickup 18 and the speaker 19 are connected with the camera mainboard 12 respectively.

The microphone 18 is used to collect a audio signal in the camera room, and send the collected audio signal to the camera mainboard 12. The camera mainboard 12 receives the audio signal sent by the microphone 18 and processes the audio signal, and sends the processed audio signal to the optical fiber transceiver 13. The audio signal processed by the camera mainboard 12 is converted into an optical signal and transmitted to an outdoor photoelectric conversion device (such as an optical fiber transceiver) by the optical fiber transceiver 13, and the optical signal is converted into an audio signal and then played on an external speaker; otherwise, the outdoor sound is converted by an outdoor electro-optical conversion device to an optical signal. The optical signal is transmitted to the optical fiber transceiver 13, and the optical fiber transceiver 13 converts the optical signal into a digital signal and transmits the digital signal to the camera mainboard 12. The camera mainboard 12 processes the digital signal and transmits the processed digital signal to the speaker 19 to make the speaker 19 emit a sound.

The camera 01 provided by the present disclosure can realize remote viewing, specifically: scene light is collected by the camera lens 11 through the electromagnetic shielding glass, the camera lens 11 outputs a video signal; the microphone can also collect the sound in the environment and output an audio signal, the video signal and the audio signal are processed by the camera mainboard 12. The camera mainboard 12 then transmits the processed audio and video signals to the optical fiber transceiver 13, which converts the audio and video signals into optical signals and transmits the optical signals to an external processing system via optical fiber. Similarly, an audio signal outside the test environment is converted into an optical signal through an outdoor optical fiber transceiver, and input into the camera shielding case 1, and then processed by the optical fiber transceiver 13 and the camera mainboard 12 in the camera shielding case 1, and then the audio signal is input to the speaker, which enable communication by telephone between the inside and outside of the test environment.

Specifically, as shown in FIG. 4, the camera shielding case 1 includes a rear end cover 17, the first filter 14 comprises a first feedthrough capacitor (not shown in FIG. 4), a first cylinder 141, a first shielding cover 142, one end of the first cylinder 141 is fastened on the inner side of the rear end cover 17 of the camera shielding case 1, the first feedthrough capacitor is accommodated in the first cylinder 141, and the first shielding cover 142 is mounted on the other end of the first cylinder 141, so that the first feedthrough capacitor is isolated in the first cylinder 141. The rear endcover 17 is designed to further shield an interference signal.

Specifically, a power hole 15 is in a fastening range of the first cylinder 141, and the power line is connected to the first feedthrough capacitor through the power hole 15; the first cylinder 141 is provided with three small holes for a lead of the first feedthrough capacitor passing through from the first cylinder 141 and entering the camera shielding case 1 to supply power.

Specifically, the first cylinder 141 is screwed to the inner side of the rear panel of the camera shielding case 1.

Specifically, the first shielding cover 142 is screwed to the other end of the first cylinder 141.

Specifically, a monitoring opening of a front panel (front part of the camera) of the camera shielding case 1 is provided with a shielding glass.

A second filter 31 is connected between the camera mainboard 12 in the camera shielding case 1 and the bus controlling module 32 in the cloud deck shielding case 3, and the second filter 31 is arranged in the cloud deck shielding case 3, and the control wire and the power line are led out by the camera mainboard and then connected to the second filter 31, and the second filter 31 is connected to the bus controlling module 32. The second filter 31 isolates the electromagnetic interference between the camera shielding case 1 and the cloud deck shielding case 3, so that the acquisition and transmission of audio and video signals in the camera shielding case 1 and control operations of the motor 33 in the cloud deck shielding case 3 can be normally performed and do not interfere with each other.

Specifically, the second filter 31 includes thesecond feedthrough capacitor, the second cylinder, and the second-shielding cover, composition and structure of the second filter 31 are basically the same as that of the first filter 14;

the difference is the mounting manner; the first filter 14 is fastened to the inner side of the rear end cover 17 of the camera shielding shell 1 through one end of the first cylinder; and the second filter 31 is fastened to the intercommunicating pore of the cloud deck shielding case 3 and the holder 2 (such as the through hole 341 or 342 in FIG. 6) through one end of the second cylinder, the diameter of the second cylinder is larger than the diameter of the through hole 341 or 342, so that the through hole 341 or 342 can be completely covered; the second feedthrough capacitor is accommodated in the second cylinder, and the second shielding cover is mounted on the other end of the second cylinder, thereby isolating the second feedthrough capacitor in the second cylinder.

It can be understood that, the power line and the control wire penetrating through the cavity of the holder pass through the intercommunicating pore where the cloud deck shielding case 3 and the holder 2 are communicated with each other and join up with the second feedthrough capacitor; the second cylinder is provided with a small hole for a lead of the second feedthrough capacitor passing through the small hole of the second cylinder and entering the cloud deck shielding case. Through the second filter, the power line and the control wire are processed by the second feedthrough capacitor before entering the cloud deck shielding case, which greatly reduces the radiation interference.

Specifically, one end of the second cylinder is provided with a mounting hole, and is fastened by a nut to the intercommunicating pore where the inner side of the cloud deck shielding case and the hollow holder are communicated with each other, and covers the intercommunicating pore; the other end of the second cylinder is provided with a thread, and the second shielding cover is screw joint with the other end of the second cylinder.

Specifically, as shown in FIG. 5, in camera 01 provided by the present disclosure, the holder 2 comprises a supporting seat 21 provided with a through hole, a hollow tube 22, and a support ring 23 provided with a through hole on the ring wall; the supporting seat 21 and the support ring 23 are respectively sealed and connected with the nozzles at both ends of the hollow tube 22 through the respective through hole; the nozzle of the hollow tube 22 which is communicated with the supporting seat 21 is nozzle 221, the nozzle of the hollow tube 22 which is communicated with the support ring 23 is not shown in FIG. 5; the support ring 23 is provided with an annular hole 231.

Specifically, the camera shielding shell 1 is mounted on the supporting seat 21, and the bottom of the camera shielding shell 1 is provided with an opening which is communicated with the nozzle 221 of the hollow tube 22; specifically, the central position of the supporting seat 21 is further provided with a mounting boss 211, the nozzle 221 passes through the mounting boss 211. The mounting boss 211 helps the camera shielding case 1 to be more closely connected to the supporting seat 21, which further prevents radiation leakage.

Figure 6:
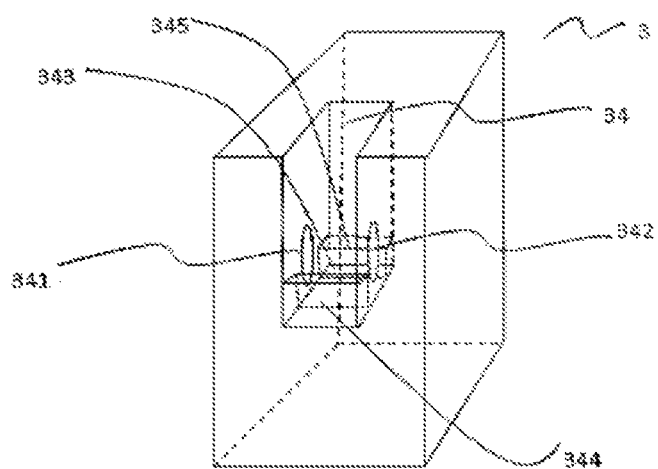
FIG. 6 is a schematic structure diagram illustrating a cloud deck shielding case according to an embodiment of the present disclosure.

FIG. 6 is a schematic structure diagram illustrating a cloud deck shielding case 3 according to an embodiment of the present disclosure. Specifically, as shown in FIG. 6, the cloud deck shielding case 3 is provided with a first groove 34, the left and right sides of the first groove 34 is provided with a left through hole 341 and a right through hole 342 respectively, the bottom of the first groove 34 is provided with a second groove 343, a front boss 344 and a rear boss 345, the bottom of the second groove 343 is provided with a worm 346, and the worm 346 is placed between the front boss 344 and the rear boss 345.

Figure 7:
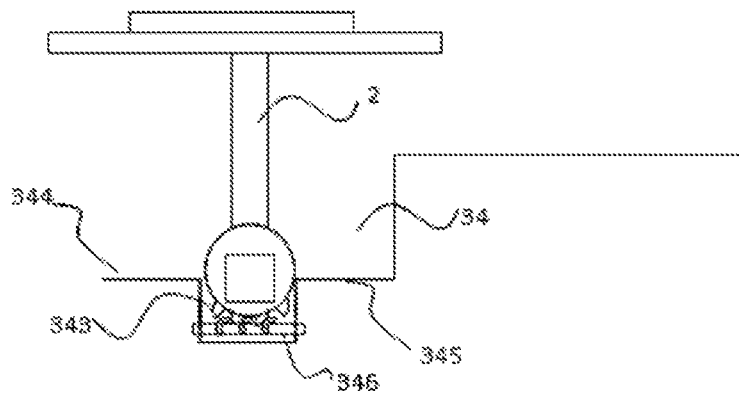
FIG. 7 is a schematic connection diagram of a cloud deck and a holder according to an embodiment of the present disclosure.

FIG. 7 is a schematic connection diagram of a cloud deck and a holder according to an embodiment of the present disclosure. Specifically, as shown in FIG. 7, the hollow holder 2 is mounted in the first groove 34, and any one of the left through hole 341 and the right through hole 342 of the first groove 34 communicates with the annular hole 231 of the support ring 23.

Furthermore, the bottom end of the support ring 23 is further provided with an engaging teeth matched with the worm 346. The holder 2 is movably connected to the worm 346 through the engaging teeth at the bottom end of the support ring 23. The front boss 344 and the rear boss 345 also have the function of supporting and restraining the support ring 23.

The vertical motor 331 drives the worm 346 to rotate, thereby driving the engaging teeth of the support ring 23 to rotate, so as to achieve the pitch of the holder 2. Since the camera shielding shell 1 is fixedly connected with the h 2, the worm 346 can drive the support ring 23 to rotate around an axis which passes through the center of the support ring 23, which in turn drives the camera shielding case 1 to perform a front and back pitching motion; thereby the pitch of the camera shielding case 1 is achieved, which expands the shooting range.

When the support ring 23 rotates around an axis which passes through the center of the support ring 23, the left and right sides of the support ring 23 are respectively in active contact with the left through hole 341 and the right through hole 342 of the first groove and cover the through holes, the annular hole 231 of the support ring 23 is always communicated with the left through hole 341 and the right through hole 342 of the left and right sides of the first groove 34 separately. Therefore, the power line and the control wire passing through the cavity of the holder can enter the left through hole 341 or the right through hole 342 through the annular hole 231 of the support ring 23, thereby accessing the second filter 31 (correspondingly, the mounting position of the second filter 31 can be set at the left through hole 341 or the right through hole 342).

The cloud deck camera provided by the present disclosure adopts a hollow holder 2, which can conveniently realize the communication between a camera case and the cloud deck. A power line and a signal line can be directly connected to the cloud deck via the hollow holder 2 through the camera case, thereby realizing internal wiring, which makes the entire camera structure with the cloud deck very compact. The dual filter circuit design, which is combined with the present disclosure, can not only effectively shield external electromagnetic interference, but also effectively isolate electromagnetic radiation generated in the camera case and the cloud deck to avoid mutual interference.

Optionally, the camera monitoring unit 0013 provided by the embodiment of the present disclosure further includes a optical fiber transceiver connected to the camera 01 provided by the present disclosure and a photoelectric conversion device connected to the on-screen display controlling unit 0014;

The on-screen display controlling unit 0014 is configured to send a control signal to the photoelectric conversion device, and is also used to acquire an electric signal (such as a video signal and/or an audio signal) transmitted by the photoelectric conversion device;

The photoelectric conversion device is configured to acquire a control signal sent by the on-screen display controlling unit, and convert the acquired signal into an optical signal and transmit the optical signal to the optical fiber transceiver of the camera 01; the photoelectric conversion device is further configured to convert the optical signal transmitted by the optical fiber transceiver of the camera 01 into an electric signal and then send the electric signal to the on-screen display controlling unit.

Specifically, the on-screen display controlling unit further includes an intercom module, and the intercom module can specifically include a pickup for collecting audio signals outside the test area;

the on-screen display controlling unit is further used for sending the audio signal collected by the intercom module to the photoelectric conversion device;

the photoelectric conversion device is further configured to acquire the audio signal transmitted by the on-screen display controlling unit, and convert the acquired audio signal into an optical signal and transmit the optical signal to the optical fiber transceiver of the camera 01.

Specifically, the intercom module can specifically include a speaker for playing the audio signal received by the on-screen display controlling unit and transmitted by the photoelectric conversion device.

Specifically, the photoelectric conversion device can include an optical fiber transceiver, and the on-screen display controlling unit can be a computer equipped with control software, and the control software includes a user interaction interface for the user to input a control signal.

EMBODIMENT TWO

An electromagnetic compatibility testing method for data on-screen display

Figure 8:
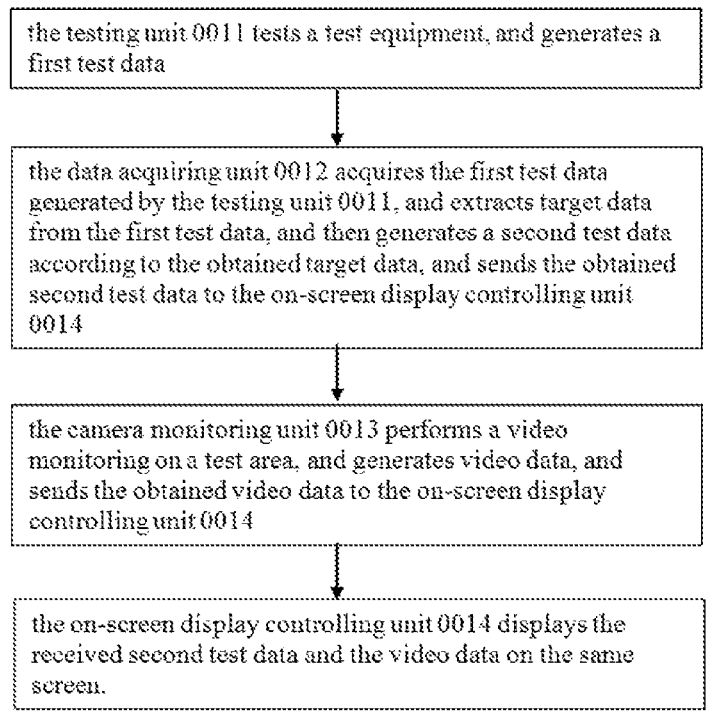
FIG. 8 is a schematic flow diagram illustrating an electromagnetic compatibility testing method for data on-screen display according to an embodiment of the present disclosure.

FIG. 8 is a schematic flow diagram illustrating an electromagnetic compatibility testing method for data on-screen display according to an embodiment of the present disclosure.

As shown in FIG. 8, the present disclosure provides an electromagnetic compatibility testing method for data on-screen display, which comprises:

the testing unit 0011 tests a test equipment, and generates a first test data;

the data acquiring unit 0012 acquires the first test data generated by the testing unit 0011, and extracts target data from the first test data, and then generates a second test data according to the obtained target data, and sends the obtained second test data to the on-screen display controlling unit 0014;

the camera monitoring unit 0013 performs a video monitoring on a test area, and generates video data, and sends the obtained video data to the on-screen display controlling unit 0014; and the on-screen display controlling unit 0014 displays the received second test data and the video data on the same screen.

According to an implementation of the present disclosure, the first test data has a fixed data structure, the first test data has at least one preset feature value and at least one target data.

Furthermore, the first test data has N target data, and the preset feature value and the $k^{th}$ target data are separated by $Q_k$ characters, wherein N and $Q_k$ are natural numbers which are not less than 1, and k is a natural number which is not greater than N; and the data acquiring unit 0012 acquiring the first test data generated by the testing unit 0011, and extracting the target data from the first test data, and generating the second test data according to the obtained target data, and sending the obtained second test data to the on-screen display controlling unit 0014, comprises:

the data acquiring unit 0012 acquires the first test data generated by the test unit 0011, and analyzes the data structure of the first test data; and the data acquiring unit 0012 captures the preset feature value from the first test data, and locates N target data in sequence according to a number of characters which separate the captured preset feature value and the $k^{th}$ target data, and then extracts N target data from the first test data; and generates the second test data according to the obtained N target data, and sends the second test data to the on-screen display controlling unit 0014.

Furthermore, the first test data has N target data, and the preset feature value and the $k^{th}$ target data are separated by $Q_k$ characters, the $k^{th}$ target data and k+1th target data are separated by $R_k$ characters, wherein N, $Q_k$, and $R_k$ are natural numbers which are not less than 1, and k is a natural number which is not greater than N; and the data acquiring unit 0012 acquiring the first test data generated by the testing unit 0011, and extracting the target data from the first test data, and generating the second test data according to the obtained target data, and sending the obtained second test data to the on-screen display controlling unit 0014, further comprises:

the data acquiring unit 0012 acquires the first test data generated by the testing unit 0011, and analyzes the data structure of the first test data; and the data acquiring unit captures the preset feature value from the first test data, and locates the $k^{th}$ target data according to a number of characters separating the captured preset feature value and the $k^{th}$ target data, and then extracts the $k^{th}$ target data from the first test data, and further locates the $k+1^{th}$ target data according to a number of characters separating the $k^{th}$ target data and the $k+1^{th}$ target data, and then extracts the $k+1^{th}$ target data from the first test data, until N target data has been captured; and the data acquiring unit 0012 generates the second test data according to the obtained N target data, and sends the second test data to the on-screen display controlling unit 0014.

According to an implementation of the present disclosure, the data acquiring unit 0012 acquiring the first test data generated by the testing unit 0011 further comprises: the data acquiring unit 0012 acquires the first test data generated by the testing unit 0011 at a preset acquisition frequency.

According to an implementation of the present disclosure, the on-screen display controlling unit 0014 includes a displaying module, the displaying module further includes a LED display, the LED display is configured to display the received second test data and the video data on the same screen.

It can be understood that, the testing unit 0011 includes but is not limited to, be used for electromagnetic radiation monitoring of equipment of broadcast television and mobile communication equipment, electromagnetic radiation monitoring of equipment of aviation, aerospace, and national defense, electromagnetic environmental safety monitoring of airport radar, radio management department, environmental electromagnetic radiation monitoring, electromagnetic field safety monitoring of workplace, EMF research of related institutes and college, electromagnetic compatibility (EMC) measuring instruments, EMS testing equipment, EMI testing equipment for electromagnetic safety testing of vehicles, medical equipment, computers, and so on; specifically, for example, Rhodes and the Schwarz (R&S) EMI test receiver or the Agilent E7405A EMC analyzer.

It can be understood that, the first test data obtained by different receivers or analyzers is further read and processed by a test software matching with the test equipment, and a real-time data storage file can be generated, and the common file format is HTML, pdf or text file; generally speaking, the first test data generated by common commercial software has a common standard and a fixed format. For example, the test data obtained by each test at each moment has two major parts, most of which are permanent parameters, and a small part are key measured values such as a frequency point and a field strength, which are required to be recorded and focused by the test personnel on the spot (it is understood that the key measured values are included in the target data acquired by the data acquiring unit 0012 in the embodiment of the present disclosure); the data storage files generated by different commercial software may have different data structures, such as the same description structure on the data content, and the same composition structure of the data composition. A person skilled in the art can write a matching software program according to the structural features of the first test data, by which automatically and directionally captures the target data, that is, obtaining the target data from the first test data.

Specifically, taking the text file generated by the test software R&S EMC32 as an example, the data acquiring unit 0012 collects the target data from the text file at a fixed time interval at a preset acquisition frequency. Each test text file can have several fixed format data sets, each data set corresponds to test data of test software R&S EMC32 at different time points. The head data and tail data of each data set are permanent parameters, the middle row value between the head and the tail are the frequency point and field strength obtained by the test, and the number of space between the target parameters such as the frequency point and the field strength is fixed (for example, separating the target parameters by 2 characters). It can be understood that, the head and tail structure of each data set can be analyzed by a designed program, and after capturing the preset feature values, and then according to the rule of the space character between the preset feature value and each target parameter, the target data can be captured in turn. Optionally, the first target data and the preset feature value are separated by spaces with fixed characters; and the target data such as the frequency point and the field strength are separated by a fixed format character space, and the software program only needs to find the first target data according to the number of spaces of the fixed character between the first target data and the preset feature value, the next target data can be searched by "jumping space" according to the preset space: until the capture of all the target data in one data set is completed, and go to the next data set.

It can be understood that, a display mode (such as the display order of the target data such as the frequency point and the field strength) of the newly generated second test data on a screen can be preset by a tester on a designed capturing software (data acquiring unit 0012).

Finally, it should be noted that, the above embodiments are merely used for the convenience of describing the present disclosure and are not limited thereto. Although the present disclosure has been described in detail with reference to the foregoing embodiments, those skilled in the art should understand that the technical solutions described in the foregoing embodiments may be modified or equivalently substituted for some or all of the technical features. These modifications and substitutions do not depart from the scope of the technical solutions of the embodiments of the present invention.

What is claimed is:

1. An electromagnetic compatibility testing system for data on-screen display, comprising: a testing unit, a data acquiring unit connected with the testing unit, a camera monitoring unit, and an on-screen display controlling unit connected with the camera monitoring unit and the data acquiring unit respectively, wherein, the testing unit is configured to test a test equipment, and generate a first test data;

the data acquiring unit is configured to acquire the first test data generated by the testing unit, and further configured to extract target data from the first test data, and generate a second test data according to the obtained target data, and send the obtained second test data to the on-screen display controlling unit;

the camera monitoring unit is configured to perform a video monitoring on a test area, and generate video data, and send the obtained video data to the on-screen display controlling unit; and the on-screen display controlling unit is configured to display the received second test data and the video data on the same screen;

wherein the first test data has a fixed data structure, the first test data having at least one preset feature value and N target data; and the preset feature value and the $k^{th}$ target data being separated by $Q_k$ characters, wherein N and $Q_k$ are natural numbers which are not less than 1, and k is a natural number which is not greater than N;

the data acquiring unit being configured to acquire the first test data generated by the testing unit, and extract the target data from the first test data, and generate the second test data according to the obtained target data, and send the obtained second test data to the on-screen display controlling unit, further comprising:

the data acquiring unit being configured to acquire the first test data generated by the test unit, and analyze the data structure of the first test data; and the data acquiring unit being further configured to capture the preset feature value from the first test data, and locate N target data in sequence according to a number of characters which separate the captured preset feature value and the $k^{th}$ target data, and then extract N target data from the first test data; and the data acquiring unit being further configured to generate the second test data according to the obtained N target data, and send the second test data to the on-screen display controlling unit.

2. An electromagnetic compatibility testing system for data on-screen display, comprising: a testing unit, a data acquiring unit connected with the testing unit, a camera monitoring unit, and an on-screen display controlling unit connected with the camera monitoring unit and the data acquiring unit respectively, wherein, the testing is configured to test a test equipment, and generate a first rest data;

the data acquiring unit is configured to acquire the first test data generated by the testing unit, and further configured to extract target data from the first test data, and generate a second test data according to the obtained target data, and send the obtained second test data to the on-screen display controlling unit;

the camera monitoring unit is configured to perform a video monitoring on a test area, and generate video data, and send the obtained video data to the on-screen display controlling unit; and the on-screen display controlling unit is configured to display the received second test data and the video data on the same screen;

wherein the first test data has a fixed data structure, the first test data having at least one preset feature value and N target data; and the preset feature value and the $k^{th}$ target data being separated by $Q_k$ characters, the $k^{th}$ target data and $k+1^{th}$ target data being separated by $R_k$ characters, wherein N, $Q_k$, and $R_k$ are natural numbers which are not less than 1, and k is a natural number which is not greater than N; and the data acquiring unit being configured to acquire the first test data generated by the testing unit, and extract the target data from the first test data, and generate the second test data according to the obtained target data, and send the obtained second test data to the on-screen display controlling unit, further comprising:

the data acquiring unit being configured to acquire the first test data generated by the testing unit, and analyze the data structure of the first test data; and the data acquiring unit being further configured to capture the preset feature value from the first test data, and locate the $k^{th}$ target data according to a number of characters separating the captured preset feature value and the $k^{th}$ target data, and then extract the $k^{th}$ target data from the first test data, and further locate the $k+1^{th}$ target data according to a number of characters separating the $k^{th}$ target data and the $k+1^{th}$ target data, and then extract the $k+1^{th}$ target data from the first test data, until N target data has been captured; and the data acquiring unit being further configured to generate the second test data according to the obtained N target data, and send the second test data to the on-screen display controlling unit.

3. An electromagnetic compatibility testing system for data on-screen display, comprising: a testing unit, a data acquiring unit connected with the testing unit, a camera monitoring unit, and an on-screen display controlling unit connected with the camera monitoring unit and the data acquiring unit respectively, wherein, the testing unit is configured to test a test equipment, and generate a first test data;

the data acquiring unit is configured to acquire the first test data generated by the testing unit, and further configured to extract target data from the first test data, and generate a second test data according to the obtained target data, and send the obtained second test data to the on-screen display controlling unit;

the camera monitoring unit is configured to perform a video monitoring on a test area, and generate video data, and send the obtained video data to the on-screen display controlling unit; and the on-screen display controlling unit is configured to display the received second test data and the video data on the same screen;

wherein the camera monitoring unit comprises a camera, the camera comprising a camera shielding case, a holder, and a cloud deck shielding case, wherein the holder is a hollow structure, and an inner cavity of the camera shielding case being communicated with an inner cavity of the cloud deck shielding case through the holder of the hollow structure; a lens, a camera mainboard, an optical fiber transceiver, and a first filter being arranged in the camera shielding case; the camera shielding case being further provided with an optical fiber interface; the lens being connected with the camera mainboard, the camera mainboard being connected with the optical fiber transceiver, the optical fiber transceiver being connected with the optical fiber interface through an optical fiber; output ends of the first filter being connected with the camera mainboard and the optical fiber transceiver respectively to supply power to the camera mainboard and the optical fiber transceiver.

4. The electromagnetic compatibility testing system for data on-screen display of claim 3, wherein the first filter comprises a first feedthrough capacitor, a first cylinder, a first shielding cover, one end of the first cylinder being fastened on the inner side of a rear end cover of the camera shielding case, the first feedthrough capacitor being accommodated in the first cylinder, and the first shielding cover being mounted on the other end of the first cylinder, so that the first feedthrough capacitor is isolated in the first cylinder.

5. The electromagnetic compatibility testing system for data on-screen display of claim 3, wherein a second filter and a bus controlling module are arranged in the cloud deck shielding case; the camera mainboard being connected with an input end of the second filter through a power line and a control wire extending through the cavity of the hollow holder, and the input end of the second filter being connected with the bus controlling module.

6. The electromagnetic compatibility testing system for data on-screen display of claim 3, wherein the hollow holder comprises a supporting seat provided with a through hole, a hollow tube, and a support ring provided with a through hole on the ring wall; the supporting seat and the support ring being respectively sealed and connected with the nozzles at both ends of the hollow tube through the respective through hole.

7. The electromagnetic compatibility testing system for data on-screen display of claim 3, wherein the cloud deck shielding case is provided with a first groove, the left and right sides of the first groove being provided with a left through hole and a right through hole respectively, the bottom of the first groove being provided with a second groove, a front boss and a rear boss, the bottom of the second groove being provided with a worm, and the worm being placed between the front boss and the rear boss.

8. The electromagnetic compatibility testing system for data on-screen display of claim 3, wherein the camera monitoring unit further comprises a photoelectric conversion device connected with the camera optical fiber transceiver and the on-screen display controlling unit respectively; wherein, the on-screen display controlling unit is configured to send a control signal to the photoelectric conversion device, and further configured to acquire an electric signal sent by the photoelectric conversion device; and the photoelectric conversion device being configured to acquire the control signal sent by the on-screen display controlling unit, and convert the acquired signal to an optical signal and transmit the optical signal to the optical fiber transceiver of the camera; the photoelectric conversion device being further configured to convert the optical signal sent by the optical fiber transceiver of the camera to an electric signal and send the electric signal to the on-screen display controlling unit.

9. The electromagnetic compatibility testing system for data on-screen display of claim 3, wherein the cloud deck shielding case is provided with a motor, and the motor driving the camera shielding case, the holder, and/or the cloud deck shielding case to move through a transmission structure.

10. The electromagnetic compatibility testing system for data on-screen display of claim 9, wherein the motor comprises a vertical motor and/or a horizontal motor, and the bus controlling module being connected with the vertical motor and/or the horizontal motor;

the horizontal motor driving the cloud deck shielding case and then driving the camera shielding case and the holder to rotate horizontally along a vertical axis through a first transmission structure; and the vertical motor driving the holder and then driving the camera shielding case to perform a pitching motion through a second transmission structure.

11. The electromagnetic compatibility testing system for data on-screen display of claim 3, wherein a pickup, a speaker are arranged in the camera shielding case, the pickup and the speaker being connected with the camera mainboard respectively.

12. The electromagnetic compatibility testing system for data on-screen display of claim 3, wherein a monitoring opening of a front panel of the camera shielding case is provided with a shielding glass.

* * * * *